(12) United States Patent
Fukuda et al.

(10) Patent No.: US 10,492,294 B2
(45) Date of Patent: Nov. 26, 2019

(54) PRINTED WIRING BOARD

(71) Applicant: FUJIKURA LTD., Tokyo (JP)

(72) Inventors: Yasuo Fukuda, Tokyo (JP); Takayuki Okamura, Akita (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/773,797

(22) PCT Filed: Oct. 12, 2016

(86) PCT No.: PCT/JP2016/080233
§ 371 (c)(1),
(2) Date: May 4, 2018

(87) PCT Pub. No.: WO2017/077828
PCT Pub. Date: May 11, 2017

(65) Prior Publication Data
US 2018/0324943 A1    Nov. 8, 2018

(30) Foreign Application Priority Data

Nov. 5, 2015  (JP) .................................. 2015-217472

(51) Int. Cl.
*H05K 1/02* (2006.01)
*H05K 1/11* (2006.01)
(Continued)

(52) U.S. Cl.
CPC ............. *H05K 1/0281* (2013.01); *H05K 1/09* (2013.01); *H05K 1/11* (2013.01); *H05K 1/147* (2013.01);
(Continued)

(58) Field of Classification Search
CPC ................. H05K 1/028; H05K 1/0281; H05K 2201/09209; H05K 2203/0369;
(Continued)

(56) References Cited

U.S. PATENT DOCUMENTS

| 5,838,412 | A | 11/1998 | Ueda et al. |
| 7,872,200 | B2 * | 1/2011 | Yokai ................... H01R 12/592 |
| | | | 174/254 |

(Continued)

FOREIGN PATENT DOCUMENTS

| JP | H09-138387 A | 5/1997 |
| JP | 2006-186273 A | 7/2006 |

(Continued)

OTHER PUBLICATIONS

The Engineering Toolbox, https://web.archive.org/web/20141019192144/http://www.engineeringtoolbox.com/young-modulus-d_417.html (Year: 2014)—copy provided with Office Action.*

(Continued)

*Primary Examiner* — Roshn K Varghese
(74) *Attorney, Agent, or Firm* — Osha Liang LLP

(57) ABSTRACT

A printed wiring board includes: an insulating base material; a first conductive layer disposed on a main surface of the insulating base material in a first region and a second region defined on a plane along the main surface; a second conductive layer disposed on a main surface of the first conductive layer in the first region; and an insulating layer disposed on the main surface of the first conductive layer in the second region. The ratio of a first evaluation value E1 to a second evaluation value E2 is 0.91 or more and 0.99 or less. The first evaluation value E1 is an evaluation value of strength of a first laminated part in the first region and the second evaluation value E2 is an evaluation value of strength of a second laminated part in the second region.

9 Claims, 4 Drawing Sheets

(51) Int. Cl.
*H05K 1/09* (2006.01)
*H05K 1/14* (2006.01)

(52) U.S. Cl.
CPC ............... *H05K 2201/032* (2013.01); *H05K 2201/0332* (2013.01)

(58) Field of Classification Search
CPC ..... H05K 2201/032; H05K 2201/0332; H05K 1/09; H05K 1/11; H05K 1/147
See application file for complete search history.

(56) References Cited

U.S. PATENT DOCUMENTS

| | | | |
|---|---|---|---|
| 2007/0148997 A1 | 6/2007 | Feldman et al. | |
| 2009/0025963 A1* | 1/2009 | Takayoshi | H05K 1/0269 174/255 |
| 2010/0277835 A1* | 11/2010 | Honjo | G11B 5/4846 174/258 |
| 2015/0027752 A1* | 1/2015 | Takakura | H05K 1/118 174/251 |

FOREIGN PATENT DOCUMENTS

| | | |
|---|---|---|
| JP | 2012-033597 A | 2/2012 |
| JP | 2014-170849 A | 9/2014 |
| JP | 2014-212272 A | 11/2014 |
| TW | 200806140 A | 1/2008 |
| TW | 200812162 A | 3/2008 |

OTHER PUBLICATIONS

International Search Report issued in corresponding International Application No. PCT/JP2016/080233 dated Dec. 27, 2016, with translation (5 pages).
Notification of Reasons for Refusal issued in corresponding Japanese Patent Application No. 2015-217472 dated Feb. 2, 2016, with translation (7 pages).
Office Action issued in corresponding Taiwanese Patent Application No. 105134254 dated Aug. 29, 2017 (7 pages).

* cited by examiner

PRINTED WIRING BOARD

TECHNICAL FIELD

The present invention relates to a printed wiring board.

BACKGROUND

Printed wiring boards are known, having a connection structure in which the average thickness of conductive patterns of a terminal part to be connected to an electronic component such as a ZIF connector is made thinner than the average thickness of conductive patterns of a wiring part (Patent Document 1).

PRIOR ART DOCUMENT

Patent Document

[Patent Document 1] JP2014-212272A

In the above prior art, the bending resistance may be insufficient when the thickness of conductive patterns of the terminal part is made thin.

SUMMARY

One or more embodiments of the present invention provide a printed wiring board that is excellent in the bending resistance.

One or more embodiments of the present invention provide a printed wiring board including an insulating base material, a first conductive layer, a second conductive layer, and an insulating layer. The first conductive layer is provided in a first region and a second region on a main surface of the insulating base material. The second region is different from the first region. The first region and the second region are set on a plane along the main surface of the insulating base material. The second conductive layer is formed in the first region on a main surface of the first conductive layer. The insulating layer is formed in the second region on the main surface of the first conductive layer. The ratio (E1/E2) of a first evaluation value E1 to a second evaluation value E2 is 0.91 or more and 0.99 or less. The first evaluation value E1 is an evaluation value of strength of a first laminated part in the first region and is obtained by Equation (1) as below. The second evaluation value E2 is an evaluation value of strength of a second laminated part in the second region and is obtained by Equation (2) as below.

$E1$=(Young's modulus of the insulating base material×thickness $T11$ of the insulating base material)+(Young's modulus of the first conductive layer×thickness $T12$ of the first conductive layer)+(Young's modulus of the second conductive layer×thickness $T15$ of the second conductive layer)       Equation (1)

$E2$=(Young's modulus of the insulating base material×thickness $T11$ of the insulating base material)+(Young's modulus of the first conductive layer×thickness $T12$ of the first conductive layer)+(Young's modulus of the insulating layer×thickness $T14'$ of the insulating layer)       Equation (2)

According to one or more embodiments of the invention, the ratio (E1/E2) of the first evaluation value E1 to the second evaluation value E2 can be 0.91 or more and 0.97 or less.

According to one or more embodiments of the invention, the insulating layer provided in the second region has an end part on the first region side and the end part can be configured so as not to be a straight line in a plan view of the printed wiring board.

According to one or more embodiments of the present invention, a printed wiring board that is excellent in the bending resistance can be provided.

DETAILED DESCRIPTION

Hereinafter, embodiments of the present invention will be described with reference to the drawings.

Figure 1:
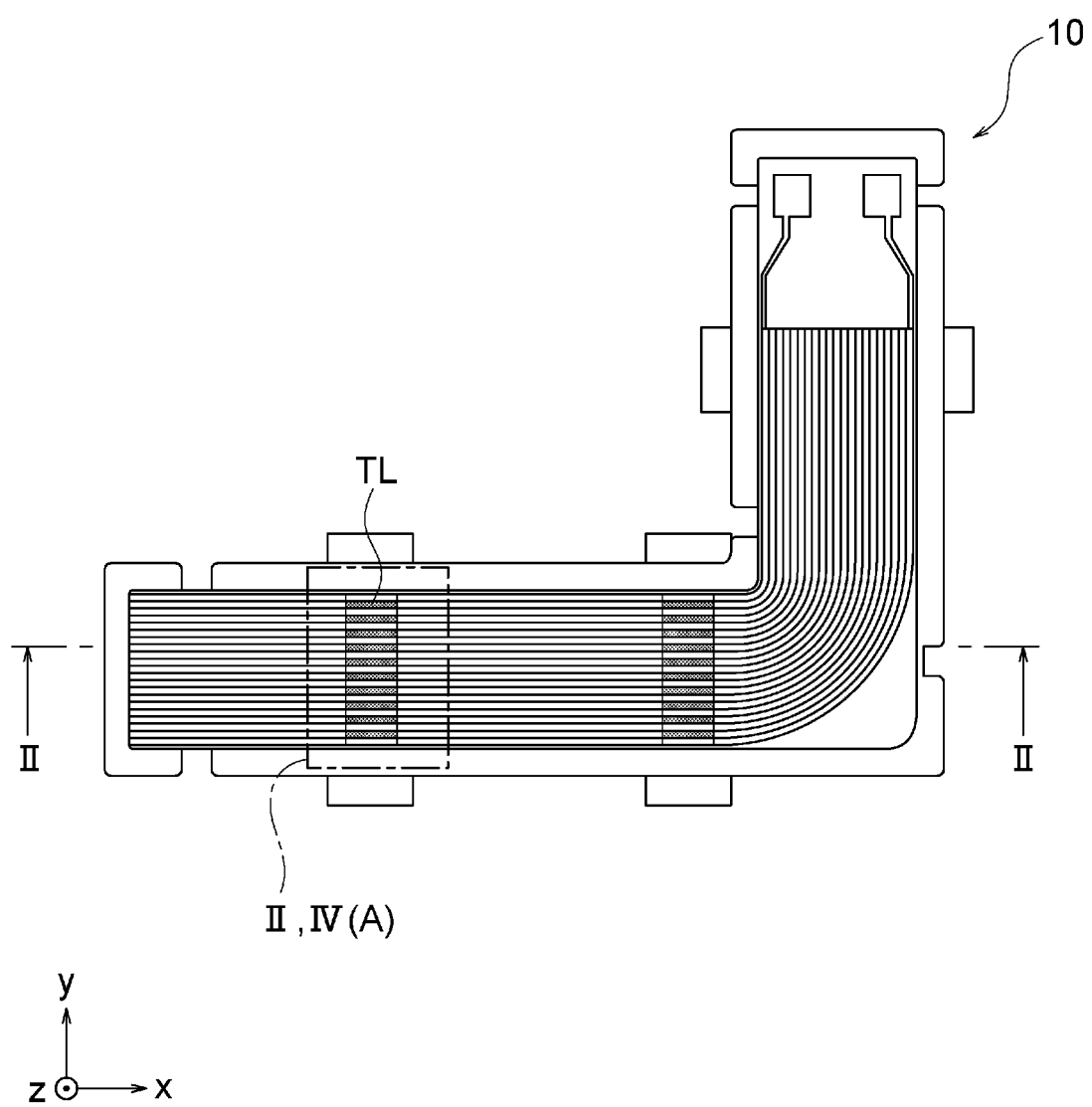
FIG. 1 illustrates a printed wiring board according to one or more embodiments of the present invention.

FIG. 1 illustrates an example of the appearance of a printed wiring board 10 according to one or more embodiments of the present invention. The printed wiring board 10 is a flexible printed circuit board (FPC) that has flexibility and is used for electronic devices.

The printed wiring board 10 in accordance with one or more embodiments has a terminal part TL that is electrically connected to a connector of another electronic device. The terminal part TL of the printed wiring board 10 is a terminal that is connected to a liquid crystal panel via an anisotropic conductive film (ACF).

Figure 2:
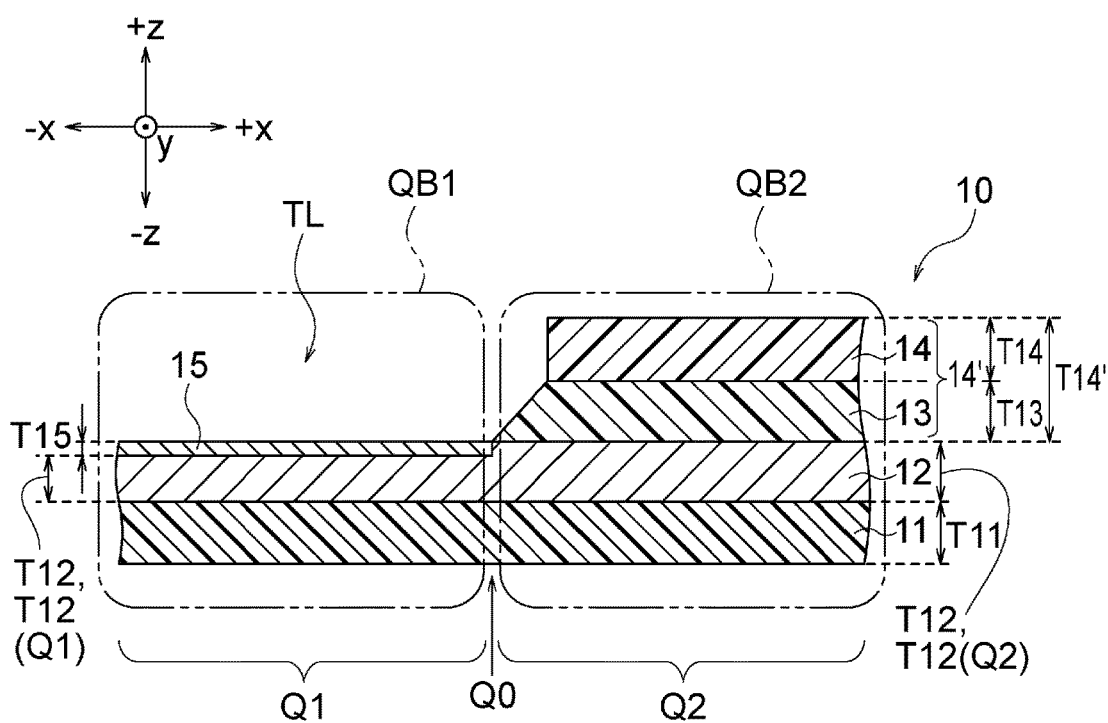
FIG. 2 is a partial cross-sectional view along line II-II of region II indicated by a dashed line in FIG. 1.

FIG. 2, which corresponds to the printed wiring board 10 in region II indicated by a dashed line in FIG. 1, is a partial cross-sectional view along line II-II illustrated in FIG. 1.

As illustrated in FIG. 2, the printed wiring board 10 in accordance with one or more embodiments includes an insulating base material 11, a first conductive layer 12 formed on a main surface (main surface on the +z side in the figure) of the insulating base material 11, a second conductive layer 15 formed in a first region Q1 of a main surface (main surface on the +z side in the figure) of the first conductive layer 12, and an insulating layer 14' formed in a second region Q2 of the main surface (main surface on the +z side in the figure) of the first conductive layer 12. The insulating layer 14' is configured to include an adhesive later 13 and an insulating layer 14. A configuration is employed in which the adhesive later 13 is formed and the insulating layer 14 is provided on a main surface (main surface on the +z side in the figure) of the adhesive later 13, but the adhesive later 13 and the insulating layer 14 may be formed as one body.

In the form illustrated in FIG. 2, the adhesive layer 13 is formed in the second region Q2 of the main surface (main surface on the +z side in the figure) of the first conductive layer 12. The insulating layer 14 is formed so as to cover the main surface (main surface on the +z side in the figure) of the adhesive later 13. When the adhesive later 13 is not formed, the insulating layer 14' of a different type is formed in the second region Q2 of the main surface (main surface on the +z side in the figure) of the first conductive layer 12. This insulating layer 14' corresponds to the insulating layer 14 formed in the second region Q2 of the main surface (main surface on the +z side in the figure) of the first conductive layer 12 without the adhesive later 13 interposed between the insulating layer 14 and the first conductive layer 12. The insulating layer 14' is formed of a single (same) material. The insulating layer 14' has a thickness T14' (height along the z-direction).

Although not particularly limited, the line/space (L/S) of the printed wiring board 10 in accordance with one or more embodiments is 50 [μm]/50 [μm] to 200 [μm]/200 [μm].

Each configuration will be described below.

The insulating base material 11 is an insulating film having flexibility. Examples of the material of the insulating base material 11 include polyethylene terephthalate (PET), polyethylene naphthalate (PEN), polyimide resin (PI), and polyether imide resin (PEI). Although not particularly limited, the thickness of the insulating base material 11 can be 10 [μm] or more and 120 [μm] or less. Preferably, the thickness can be 15 [μm] or more and 75 [μm] or less. According to one or more embodiments, the insulating base material 11 of a polyimide resin having a thickness of 25 [μm] is used.

An adhesive layer may be formed between the insulating base material 11 and the first conductive layer 12. A printed wiring board in which an adhesive layer is formed between the insulating base 11 and the first conductive layer 12 is also an embodiment of the printed wiring board 10 in accordance with one or more embodiments of the invention.

According to one or more embodiments, the first region Q1 and the second region Q2 are set on a plane (xy plane in FIG. 2) along the main surface of the insulating base material 11. The first region Q1 is set on the xy plane on the −x side (left side) in FIG. 2 with respect to a reference plane Q0 that is set in the width direction (approximately perpendicular direction to the connection direction to a connector, the +/−y direction in the example of FIG. 2) and the height direction (+/−z direction in the example of FIG. 2) of the printed wiring board 10, and the second region Q2 is set on the xy plane on the +x side (right side) of the reference plane Q0. The second region Q2 is a region different from the first region Q1. Positions of the first region Q1 and second region Q2 in the z-axis direction (z-coordinate values) can be freely set.

The first region Q1 is set on the terminal part TL side (−x side in the figure), which comes into contact with an external connector, with respect to the reference surface Q0. The second region Q2 is set on the side (+x side in the figure) opposite to the terminal part TL side with respect to the reference surface Q0. The first region Q1 and the second region Q2 are different regions, and these regions do not overlap with each other. The first region Q1 can be defined by xy coordinates. The first region Q1 is a region in which the xy coordinates are common. The first region Q1 may be defined as a three-dimensional region having a height. In this case, in addition to the xy coordinates, an arbitrary height along the z-axis can be set, and that region can be set using the xyz coordinates. Likewise, the second region Q2 can be defined by xy coordinates. The second region Q2 is also a region in which the xy coordinates are common. The second region Q2 may be defined as a three-dimensional region having a height. In this case, in addition to the xy coordinates, an arbitrary height along the z-axis can be set, and that region can be set using the xyz coordinates.

The first conductive layer 12 is provided at least in a part of the first region Q1 and at least in a part of the second region Q2 on the main surface (main surface on the +z side in the figure) of the insulating base 11. The first conductive layer 12 is composed of a conductive material such as copper, silver, gold, and carbon. The first conductive layer 12 in accordance with one or more embodiments is composed of copper or a material that contains copper. The first conductive layer 12 is not necessarily provided over the entire surface of the first region Q1 and/or the second region Q2, and is formed at least in a part of the region or regions in accordance with a desired wiring pattern. The wiring pattern of the first conductive layer 12 can be formed by removing predetermined regions of a copper foil or other metal foil that is preliminarily attached to the insulating base material 11, using a photolithography technique. The wiring pattern of the first conductive layer 12 may also be formed of a conductive paste material using a screen printing technique. The copper foil which is preliminarily attached to the insulating base material 11 is preferably a rolled copper foil.

The first conductive layer 12 may also be formed by plating. The first conductive layer 12 may also be formed by a so-called semi-additive method.

Although not particularly limited, the thickness (height along the z-direction) of the first conductive layer 12 can be 3 [μm] or more and 25 [μm] or less. Preferably, the thickness can be 10 [μm] or more and 20 [μm] or less. The thickness of the first conductive layer 12 in accordance with one or more embodiments is 22 [μm]. The function of the first conductive layer 12 is not limited to that of a signal line and includes a function as a contact or a ground layer.

The thickness (height along the z-direction in the figure) of the first conductive layer 12 in accordance with one or more embodiments may be different in each region. The value of the thickness (T12(Q1)) of the first conductive layer 12 in the first region Q1 is smaller than the value of the thickness (T12(Q2)) of the first conductive layer 12 in the second region Q2. That is, the thickness (T12(Q1)) of the first region Q1 close to the terminal part TL of the first conductive layer 12 is thinner than the thickness (T12(Q2)) of the second region Q2 far from the terminal portion TL. The first conductive layer 12 in the first region Q1 and the first conductive layer 12 in the second region Q2 are continuous at the boundary Q0 between the first region Q1 and the second region Q2.

By forming a resist layer on a region other than the first region Q1 and performing an etching process, the thickness (T12(Q1)) of the first conductive layer 12 in the first region Q1 can be made thinner than the thickness (T12(Q2)) of the first conductive layer 12 in the second region Q2. The etching process may be performed after forming the adhesive later 13 and the insulating layer 14. In this case, the process of forming the resist layer for the etching process can be omitted.

In addition or alternatively, by forming a resist layer on the first region Q1 and performing a plating process, the thickness (T12(Q2)) of the first conductive layer 12 in the second region Q2 can be made thicker than the thickness (T12(Q1)) of the first conductive layer 12 in the first region Q1.

The etching amount of the first conductive layer 12 can be controlled by setting the etching conditions such as the concentration of the etching liquid used for the etching process, temperature of the etching liquid used for the etching process, reaction rate for the etching process, and processing time for the etching process. Thus, the thickness (T12(Q1)) of the first conductive layer 12 in the first region Q1 can be set to a desired thickness.

The second conductive layer 15 is formed in the first region Q1 on the main surface (surface on the +z side in the figure) of the first conductive layer 12. The second conductive layer 15 is a plating layer. The second conductive layer 15 is formed through a nickel plating process, gold plating process, Ni/Au (nickel/gold) plating process, or the like. The second conductive layer 15 may be formed through an electrolytic plating process or may also be formed through an electroless plating process. The second conductive layer 15 functions as a contact with an external electronic device. The thickness (height along the z-direction) of the second conductive layer 15 can be set to 2 [μm] or more and 20 [μm] or less. Preferably, the thickness can be 2 [μm] or more and 5 [μm] or less. The thickness of the second conductive layer 15 in accordance with one or more embodiments is 2 to 4 [μm].

The adhesive layer 13 is formed in the second region Q2 on the main surface (surface on the +z side in the figure) of the first conductive layer 12. That is, the adhesive layer 13 is formed in the second region Q2 in which the second conductive layer 15 is not formed. Examples of the adhesive used in accordance with one or more embodiments include an acrylic-based resin, styrene rubber, and polyphenylene ether. The adhesive is not particularly limited, and it is possible to use a polyamide-based hot-melt adhesive, polyurethane-based hot-melt adhesive, polyester-based hot-melt adhesive, and olefin-based hot-melt adhesive. Although not particularly limited, the thickness of the adhesive layer 13 can be 3 [μm] or more and 25 [μm] or less. Preferably, the thickness can be 5 [μm] or more and 15 [μm] or less. The thickness T13 of the adhesive layer 13 is 7.5 [μm].

The insulating layer 14 covers at least a part of the adhesive layer 13. The insulating layer 14 functions as a protective layer (coverlay). Since the adhesive layer 13 is provided in the second region Q2, the insulating layer 14 provided on the main surface of the adhesive layer 13 is also formed in the second region Q2. Examples of the material of the insulating layer 14 include polyethylene terephthalate (PET), polyethylene naphthalate (PEN), polyimide resin (PI), and polyether imide resin (PEI). The insulating layer 14 is preferably composed of the same material as the insulating base material 11. Although not particularly limited, the thickness of the insulating layer 14 can be 7.5 [μm] or more and 35 [μm] or less. Preferably, the thickness can be 10 [μm] or more and 15 [μm] or less. In one or more embodiments, the insulating layer 14 made of a polyimide resin having a thickness of 12.5 [μm] is used.

In one or more embodiments, the form is described in which the adhesive later 13 and the insulating layer 14 are provided, but as previously described, the insulating layer 14' may be provided without providing the adhesive later 13. In this case, the insulating layer 14' is formed using a liquid resist.

A method of manufacturing the printed wiring board 10 in accordance with one or more embodiments is as follows.

First, the insulating base material 11 is prepared such that the first conductive layer 12 is formed at least on the main surface of the insulating base material 11. A predetermined region of the first conductive layer 12 is removed by an etching process to form the first conductive layer 12 having a desired pattern. The adhesive layer 13 having an arbitrary thickness is formed in the second region Q2 on the main surface side (+z side in the figure) of the first conductive layer 12. The insulating layer 14 having an arbitrary thickness is laminated so as to cover the adhesive layer 13. When the adhesive layer 13 is not formed, the insulating layer 14' having an arbitrary thickness is formed in the second region Q2 on the main surface side (+z side in the figure) of the first conductive layer 12. In this case, it is preferred to use a liquid resist. In this state, an etching liquid is made to act with the first region Q1 (region in which the adhesive layer 13 and the insulating layer 14 are not formed) of the first conductive layer 12. The time for the etching liquid to act is adjusted to perform the etching process so that the thickness of the first conductive layer 12 in the first region Q1 becomes a predetermined thickness.

Thereafter, a plating liquid is made to act with the main surface side (+z side in the figure) of the first conductive layer 12 in the first region Q1. The time for the plating liquid to act is adjusted to perform the plating process so that the thickness of the second conductive layer 15 in the first region Q1 becomes a predetermined thickness. The second conductive layer 15 in the first region Q1 formed through this plating process functions as a contact with a connector of an external electronic component. That is, in the printed wiring board 10 in accordance with one or more embodiments, the second conductive layer 15 is formed on the uppermost surface of the first region Q1, and the adhesive layer 13 and the insulating layer 14 are formed (or the insulating layer 14' is formed) on the uppermost surface of the second region Q2. In other words, in the printed wiring board 10, the adhesive layer 13 and the insulating layer 14 do not exist in the first region Q1 and the second conductive layer 15 does not exist in the second region Q2. In the printed wiring board 10, the second conductive layer 15 is exposed in the first region Q1, but the first conductive layer 12 in the second region Q2 is covered with the insulating layer 14 (or 14') and is therefore not exposed.

Through these processes, the printed wiring board 10 can be obtained with various combinations of the thickness of the first conductive layer 12 in the first region Q1, the thickness of the first conductive layer 12 in the second region Q2, the thickness of the second conductive layer 15 in the first region Q1, the thickness of the adhesive later 13 in the second region Q2, and the thickness of the insulating layer 14 in the second region Q2.

As illustrated in FIG. 1, in the printed wiring board 10 in accordance with one or more embodiments, the terminal part TL, which is to be electrically connected to an external connector, is formed between one end part and the other end part of the printed wiring board 10 rather than at an end part (tip end or base end) of the printed wiring board 10. In other words, the terminal part TL, which is to be electrically connected to an external connector, is not formed at an end part (tip end or base end) of the printed wiring board 10. That is, the printed wiring board 10 is not a printed wiring board, such as for a zero insertion force (ZIF) connector, in a form in which the terminal part at the tip end or base end is stabbed into and connected to the connector of a counterpart electronic component when mounted on the counterpart electronic component.

As illustrated in FIGS. 1 and 2, the terminal part TL of the printed wiring board 10 in accordance with one or more embodiments is electrically connected to another electronic component in a plane along the xy-coordinate system. The terminal part TL of the printed wiring board 10 is connected to another electronic component via a conductive adhesive medium such as an anisotropic conductive film (ACF). That is, the terminal part TL of the printed wiring board 10 is a terminal that is connected to another electronic component by compression bonding in a state in which a conductive material having an adhesive function, such as an ACF and an anisotropic conductive paste (ACP), is interposed between the terminal and another electronic component.

In the printed wiring board 10 in accordance with one or more embodiments, an ACF or ACP is disposed on the main surface side (+z side in the figure) of the second conductive layer 15 in the first region Q1, and the second conductive layer 15 is electrically connected to the connector of another electronic component via the ACF or ACP.

Although not particularly limited, in one or more embodiments, the difference between the total height (T12(Q1)+T15) of the first conductive layer 12 and second conductive layer 15 in the first region Q1 and the height (T12(Q2)) of the first conductive layer 12 in the second region Q2 is 0.1 [μm] or less. More preferably, the difference between the total height (T12(Q1)+T15) of the first conductive layer 12 and second conductive layer 15 in the first region Q1 and the height (T12(Q2)) of the first conductive layer 12 in the second region Q2 may be zero, that is, both the heights can be approximately equal to or equal to each other.

When the second conductive layer 15 is formed to form the terminal part TL in the first region Q1, the height of the conductive layers in the first region Q1 is higher than when the second conductive layer 15 is not formed. When bonding the terminal part TL to another connector by compression, a conductive filler used for the ACF or ACP is disposed on the main surface of the second conductive layer 15. When the height of the conductive layers in the first region Q1 is high, the conductive filler may be pushed out during the compression bonding to escape into spaces between conductive lines (seam) in/of the first region Q1. If the conductive filler is pushed out, the number of particles of conductive filler (the amount of conductive filler) necessary between the second conductive layer 15 and the connector of another electronic component may be insufficient. If the number of particles of conductive filler (the amount of conductive filler) is insufficient, the connection resistance may be very high, and connection failure may possibly occur.

According to one or more embodiments, with consideration for the balance with the structural strength, the difference between the total height (T12(Q1)+T15) of the first conductive layer 12 and second conductive layer 15 in the first region Q1 and the height (T12(Q2)) of the first conductive layer 12 in the second region Q2 is made very small to zero. On the other hand, when the height of the second conductive layer 15 is lower than the height of the first conductive layer 12 in the second region Q2, the distance to the connector of an electronic component to be connected increases. In this case, sufficient electric conductivity cannot be ensured, and conductivity failure may possibly occur. For these reasons, the difference between the height value of the surface of the second conductive layer 15 in the first region Q1 and the height value of the surface of the first conductive layer 12 in the second region Q2 is preferably reduced, and both the heights are further preferably the same (the difference is zero). This can result in the improved electrical connectivity between the printed wiring board 10 and another electronic component.

In some cases, the printed wiring board 10 in accordance with one or more embodiments may be folded or bent and housed in the housing of an electronic device. In this case, the printed wiring board 10 is bent. Various stresses are applied to the bending portion caused by receiving the bending force. In particular, the printed wiring board 10 housed in the housing is in a bent state for a long time.

Figure 3:
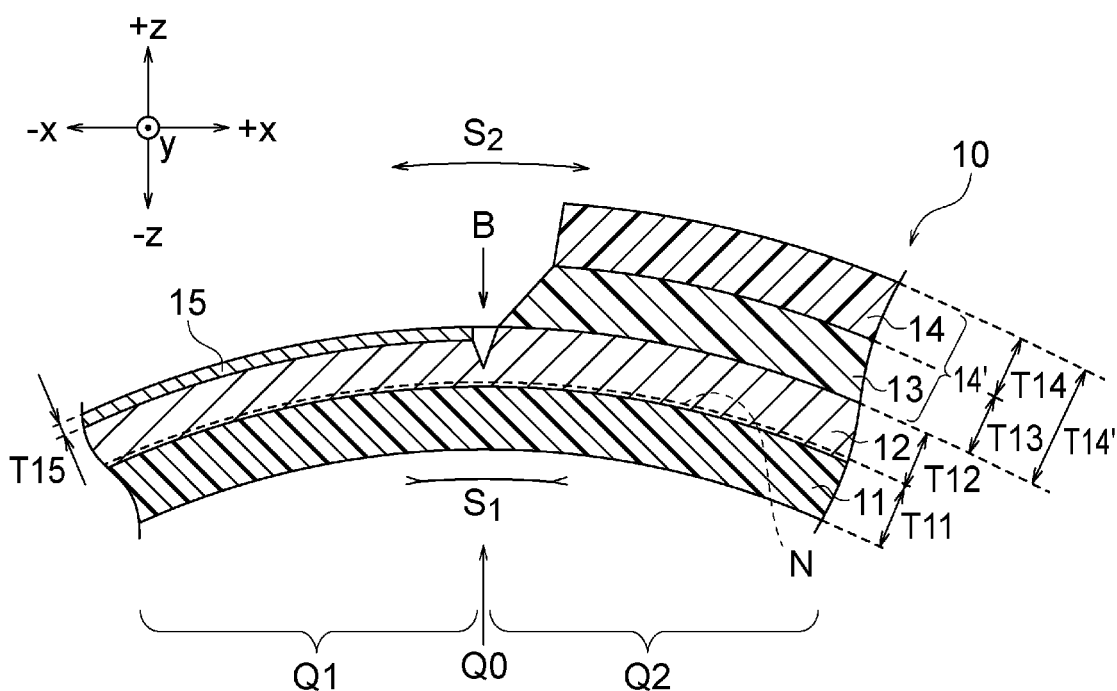
FIG. 3 is a cross-sectional view corresponding to FIG. 2 when the printed wiring board illustrated in FIG. 1 is bent.

FIG. 3 illustrates a state in which the printed wiring board 10 illustrated in FIG. 2 is bent. FIG. 3 is a view schematically illustrating an example of how the stress is applied when the printed wiring board 10 is bent. The printed wiring board of FIG. 3 has a multilayer structure of an insulating base material 11, a first conductive layer 12, a second conductive layer 15, an adhesive layer 13, and an insulating layer 14. When such a printed wiring board 10 of a multilayer structure is bent, a compression stress S1 is applied inside the printed wiring board 10, and a tensile stress S2 is applied outside the printed wiring board 10. The stress is minimized at the center (indicated by a broken line N) at which the compressive stress S1 and the tensile stress S2 are balanced. If the first conductive layer 12 can be disposed at the position at which the stress is minimized, the bending resistance of the printed wiring board 10 can be improved.

However, as in the printed wiring board 10 in accordance with one or more embodiments, in the case of having a structure with the conductive layer, which is exposed to the outside in a partial region and functions as a contact, in order to form the terminal part TL between one end part and the other end part of the printed wiring board 10, that is, in the case in which the printed wiring board 10 is physically one printed wiring board but has a different laminated structure in part, the position at which the stress is minimized may not be determined in a reproducible manner. As in the printed wiring board 10, when the laminated structure of a first laminated part QB1 formed in the first region Q1 and the laminated structure of a second laminated part QB2 formed in the second region Q2 (region different from the first region Q1) are different, the compressive stress S1 and the tensile stress S2 are different in the laminated structures of the first laminated part QB1 and the second laminated part QB2.

As in the printed wiring board 10 in accordance with one or more embodiments, when a structure is employed in which the laminated structure of the first laminated part QB1 in the first region Q1 and the laminated structure of the second laminated part QB2 in the second region Q2 are different, the possibility that cracks occur at the boundary B between the first laminated part QB1 and the second laminated part QB2 cannot be denied.

It may be conceivable to increase the thickness of each material in order to improve the strength, but this contradicts the demand of reduction in size/thickness of an electronic component.

Thus, it has been difficult to achieve both of responding to the demand for a reduced thickness and improving the bending resistance in the printed wiring board 10 because the second conductive layer 15, which functions as the terminal part TL to be electrically connected to another electronic component, is provided between one end part and the other end part of the printed wiring board 10 (provided at a position different from any of the end parts) so that the printed wiring board 10 includes the first laminated part QB1 and the second laminated part QB2 which have different laminated structures.

According to one or more embodiments, a first evaluation value E1 that is an evaluation value of strength of the first laminated part QB1 is calculated, and a second evaluation value E2 that is an evaluation value of strength of the second laminated part QB2 is calculated. Here, the first laminated part QB1 includes the second conductive layer 15 formed in the first region Q1 and does not include the adhesive layer 13, the insulating layer 14, and the insulating layer 14'. The second laminated portion QB2 includes the insulating layer 14' (the adhesive layer 13 and the insulating layer 14) formed in the second region Q2 and does not include the second conductive layer 15. The first laminated part QB1 includes the insulating base material 11 in a region corresponding to the first region Q1, the first conductive layer 12 formed on the main surface of the insulating base material 11, and the second conductive layer 15 formed on the main surface of the first conductive layer 12. That is, the first laminated part QB1 defines the extension on the plane of the first region Q1 by the xy coordinates, and the z coordinate can be defined by the total value of the thicknesses of the first conductive layer 12 and the second conductive layer 15. The first laminated part QB1 is defined as a three-dimensional structure by the xyz coordinates.

The second laminated part QB2 includes the insulating base material 11 in a region corresponding to the second region Q2, the first conductive layer 12 formed on the main surface of the insulating base material 11, and the insulating layer 14' formed on the main surface of the first conductive layer 12. When an adhesive material is used in the second laminated part QB2, the second laminated part QB2 includes the adhesive later 13 formed on the main surface of the first conductive layer 12 and the insulating layer 14 formed on the main surface of the adhesive later 13. That is, the second laminated part QB2 defines the extension on the plane of the second region Q2 by the xy coordinates, and the z coordinate can be defined by the total value of the thicknesses of the first conductive layer 12 and the insulating layer 14' (the total value of the thicknesses of the first conductive layer 12, the adhesive later 13, and the insulating layer 14). The second laminated part QB2 is defined as a three-dimensional structure by the xyz coordinates.

According to one or more embodiments, in the printed wiring board 10 in which the laminated structure in the first region Q1 and the laminated structure in the second region Q2 different from the first region Q1 are different, the relationship between the strength of the first laminated part in the first region Q1 and the strength of the second laminated part in the second region Q2 is taken into account thereby to improve the bending resistance while reducing the thickness.

Specifically, in one or more embodiments, the first evaluation value E1 which is an evaluation value of strength of the first laminated part QB1 in the first region Q1 illustrated in FIG. 2 is calculated, and the second evaluation value E2 which is an evaluation value of strength of the second laminated part QB2 is calculated.

Here, the first evaluation value E1 is obtained using the following Equation (1) and the second evaluation value E2 is obtained using the following Equation (2).

First evaluation value $E1$=(Young's modulus of the insulating base material 11×thickness $T11$ of the insulating base material 11)+(Young's modulus of the first conductive layer 12×thickness $T12$ of the first conductive layer 12)+(Young's modulus of the second conductive layer 15×thickness $T15$ of the second conductive layer 15)     Equation (1)

Second evaluation value $E2$=(Young's modulus of the insulating base material 11×thickness $T11$ of the insulating base material 11)+(Young's modulus of the first conductive layer 12×thickness $T12$ of the first conductive layer 12)+(Young's modulus of the insulating layer 14'×thickness $T14'$ of the insulating layer 14')     Equation (2)

When the insulating layer 14' does not include the adhesive later 13 in the second laminated part QB2, the thickness T13 of the adhesive later 13 is zero; therefore, in the above Equation (2), (Young's modulus of the insulating layer 14'×thickness T14' of the insulating layer 14')=(Young's modulus of the insulating layer 14×thickness T14 of the insulating layer 14) is established.

When the insulating layer 14' includes the adhesive later 13 in the second laminated part QB2, the following Equation (2a) is used when obtaining the second evaluation value E2 of the insulating layer 14'.

Second evaluation value $E2$=(Young's modulus of the insulating base material 11×thickness $T11$ of the insulating base material 11)+(Young's modulus of the first conductive layer 12×thickness $T12$ of the first conductive layer 12)+(Young's modulus of the adhesive later 13×thickness $T13$ of the adhesive later 13)+(Young's modulus of the insulating layer 14×thickness $T14$ of the insulating layer 14)     Equation (2a)

According to one or more embodiments, Young's moduli (tensile elastic moduli) are measured using a method known at the time of filing of this application in accordance with an appropriate standard, such as ISO 527-1, JIS K7127, and JIS K7161. The Young's modulus of each material used in the above Equations (1) and (2) is preferably measured using a common measuring method.

Then, the ratio (E1/E2) of the first evaluation value E1 to the second evaluation value E2 is calculated. The ratio (E1/E2) of the evaluation values is preferably 0.85 or more and 1.23 or less. According to one or more embodiments, the thicknesses of members are adjusted so that the ratio (E1/E2) of the evaluation values is within a range of 0.85 or more and 1.23 or less. Specifically, the thickness of the insulating base material 11, the thickness of the first conductive layer 12, the thickness of the second conductive layer 15, and the thickness of the insulating layer 14' (or the thickness of the adhesive later 13 and the thickness of the insulating layer 14) are adjusted so that the ratio (E1/E2) of the evaluation values is within a range of 0.85 or more and 1.23 or less.

Through this adjustment, the bending strength of the entire printed wiring board 10 can be improved with consideration for the Young's modulus and thickness of each constitutional member of the printed wiring board 10. As a result, the printed wiring board 10 can be provided which is excellent in the bending resistance and has high reliability.

The ratio (E1/E2) of the first evaluation value E1 to the second evaluation value E2 is preferably 0.85 or more and 1.14 or less. This allows the above action and effect to be further obtained.

The ratio (E1/E2) of the first evaluation value E1 to the second evaluation value E2 is preferably 0.85 or more and 1.04 or less. This allows the above action and effect to be further obtained.

According to one or more embodiments, the insulating layer 14' provided in the second region Q2 has an end part (edge part) on the first region Q1 side, and the end part/portion (edge part/edge portion) is formed so as not to be a straight line (a non-linear shape) in the plan view of the printed wiring board 10.

Figure 4A:
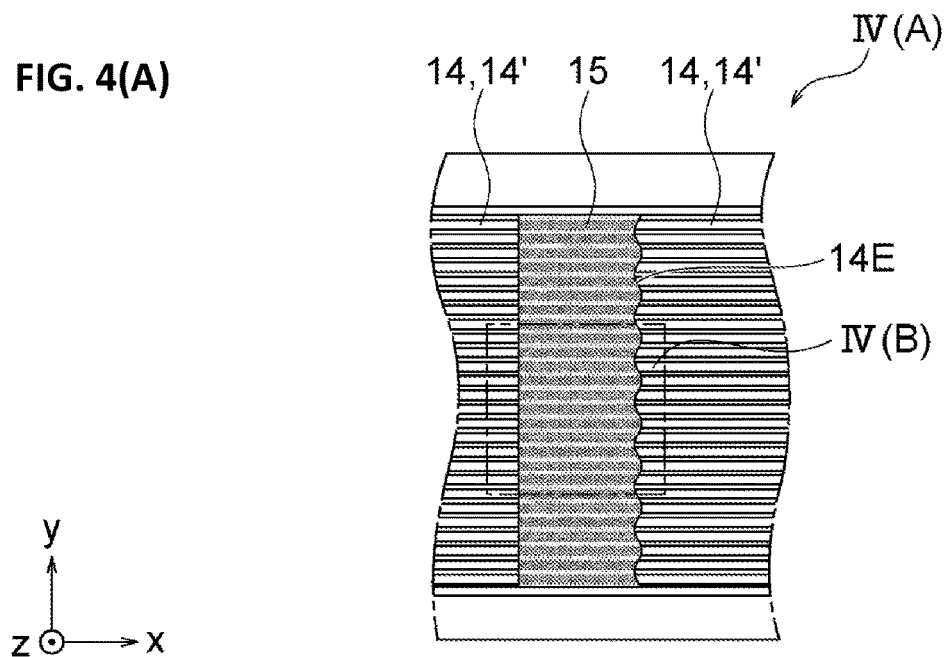
FIG. 4(A) is a partially enlarged view of region IV(A) illustrated in FIG. 1.

FIG. 4(A) is a partially enlarged view illustrating region IV (A) indicated by a dashed line illustrated in FIG. 1. FIG. 4(A) illustrates a boundary region between the first region Q1 and the second region Q2 in the plan view. FIG. 4 (A) illustrates a boundary portion between the insulating layer 14' formed on the surface of the second region Q2 and the second conductive layer 15 formed on the surface of the first region Q1. As illustrated in the figure, the insulating layer 14' provided in the second region Q2 has an that constitutes the end part on the first region Q1 side, and the shape of the edge part 14E is not in a straight-line shape (is a non-linear shape) in the plan view of the printed wiring board 10.

Figure 4B:
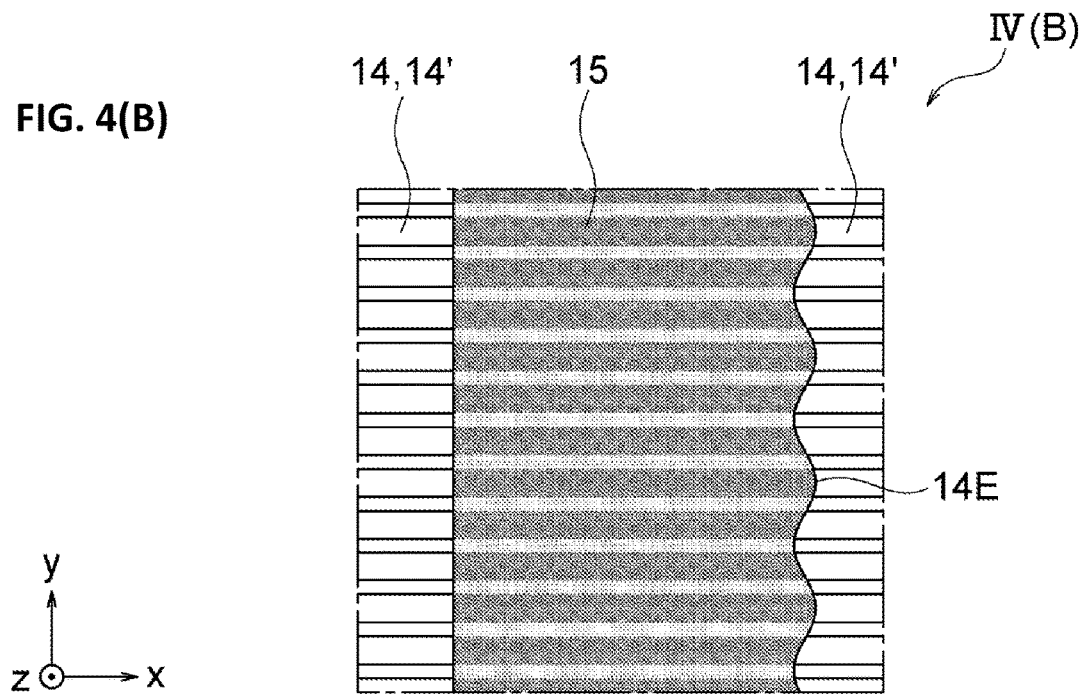
FIG. 4(B) is a partially enlarged view of region IV(B) illustrated in FIG. 4(A).

FIG. 4(B) is a partially enlarged view illustrating region IV (B) indicated by a dashed line illustrated in FIG. 4(A). As illustrated in FIG. 4(B), the shape of the edge part 14E, which forms the end part on the first region Q1 side of the insulating layer 14' (14) provided in the second region Q2, is not a straight line (is a non-linear shape). In other words, positions of the edge part 14E in the X-direction in the figure are not the same. The position of the edge part 14E in the X-direction in the figure includes positions shifted to the +X side and positions shifted to the −X-direction side. The edge part 14E in accordance with one or more embodiments is preferably formed to have a line-like shape having vertices. Positions of the vertices are preferably positions based on a predetermined rule. Although not particularly limited, the shape of the edge part 14E is preferably formed to be a wave shape. The wave shape is preferably a shape having vertices on the upper-wave side and vertices on the lower-wave side. It is preferred to have a wave shape in which vertices (local maximum) that are convex in the +X-direction in the figure and vertices (local minimum) that are convex in the −X-direction in the figure appear alternately. In FIG. 4(B), the insulating base material 14' (14) illustrated in FIG. 4(A) is an example of the wave shape which has vertices on the upper-wave side (+X side in the figure) and vertices on the lower-wave side (−X side in the figure), and they are adjacent to each other. The shape of the wave shape is not particularly limited, and the frequency, period, phase, wavelength, and amplitude can be freely set. For example, the shape of the edge part 14E may be a sine function, and the amplitude, angular frequency, and phase may be appropriately set.

Thus, by setting the shape of the edge part 14E of the insulating layer 14' in contact with the second conductive layer 15 so as not to be a straight line (so as to be a non-linear shape), the stress applied to the edge part 14E of the insulating layer 14 when bent can be distributed. In particular, by setting the shape of the edge part 14E to have a wave shape having vertices on the upper-wave side and vertices on the lower-wave side, the stress applied to the edge part 14E of the insulating layer 14 when bent can be evenly distributed. As a result, the number of times of bend holding of the printed wiring board 10 can be further improved.

Although not particularly limited, the end part of a sheet-like insulating layer 14' may be cut into a shape that is not a straight-line (non-linear shape), such as a wave shape, and the edge part 14E of the insulating layer 14' can thereby be made to have a shape that is not a straight-line (non-linear shape), such as a wave shape.

Examples of one or more embodiments of the present invention will be described hereinafter.

EXAMPLES

Examples using test pieces which in accordance with one or more embodiments of the present invention will be described below.

To confirm the performance of the printed wiring board 10, five test pieces were prepared for each example having the structure illustrated in FIG. 2 and having the copper foil etching amount and Ni plating thickness as listed in Table 1 below. Each test piece was subjected to a bending test, and the bending resistance of each test piece was evaluated.

Each test piece was prepared by the following method.

A single-sided copper-clad base material was prepared in which a first conductive layer 12 (copper foil) having a thickness of 22 [μm] was formed on a main surface of a polyimide resin insulating base material 11 having a predetermined size and a thickness of 25 [μm]. A predetermined region of the first conductive layer 12 (copper foil) was removed using a known photolithography technique to form predetermined wirings.

The Young's modulus of the insulating base material 11 made of polyimide resin (PI) used in the present examples was 7.5 [GPa]. The Young's modulus of the first conductive layer 12 made of copper was 130 [GPa].

Subsequently, a predetermined region on one of right/left sides of a preliminarily set reference plane Q0 (see FIG. 2) was defined as a first region Q1 and a predetermined region on the other side was defined as a second region Q2. The first area Q1 and the second area Q2 were set to have the same area.

Then, a coverlay film (CVA 0525 available from Arisawa Mfg. Co., Ltd.) was attached to the second region Q2 to form an adhesive layer 13 and an insulating layer 14. The thickness T13 of the adhesive layer 13 used in the present examples was 7.5 [μm] and the Young's modulus was 1.3 [GPa]. The thickness T14 of the insulating layer 14 was 12.5 [μm]. The Young's modulus of the polyimide resin insulating layer 14 used in the present examples was 4.1 [GPa]. In the present examples, the insulating layer 14' includes the adhesive layer 13 and the insulating layer 14.

Thereafter, the surface of the first conductive layer 12 (copper foil) was subjected to an etching process using an etching liquid obtained by mixing sulfuric acid and hydrogen peroxide. The time of the etching process was controlled thereby to adjust the thickness of the first conductive layer 12 (copper foil). Specifically, the larger the etching amount, the longer the etching process time was prolonged, while the smaller the etching amount, the shorter the etching process time was shortened, and the etching amount listed in Table 1 was thus achieved. The etching liquid may be appropriately selected in accordance with the metal type/speciation of the first conductive layer 12. For example, when the first conductive layer 12 is formed of nickel, an etching liquid obtained by mixing nitric acid and sulfuric acid can be used.

Subsequently, the first region Q1 of the first conductive layer 12 was nickel-plated to form a nickel plating layer as the second conductive layer 15. In the plating process, the plating process time was adjusted thereby to set the thickness T15 of the second conductive layer 15 to the thickness as listed in Table 1 below. The Young's modulus of the nickel plating layer (second conductive layer 15) in the present examples was 200 [GPa].

As listed in Table 1 below, a plurality of test pieces was prepared for each of examples (Comparative Examples 1 to 4 and Examples 1 to 19) in which the etching amount (decreased amount of the thickness) of the first conductive layer 12 with the original thickness of 22 [μm] was different and the thickness (increased amount of the thickness) of the second conductive layer 15 newly formed by the plating process was different.

For each test piece, the first evaluation value E1 was calculated using the above Equation (1). Likewise, for each test piece, the second evaluation value E2 was calculated using the above Equation (2). Further, the ratio (E1/E2) of the first evaluation value E1 to the second evaluation value E2 was calculated and listed in Table 1 as below.

For each of the test pieces thus prepared, the number of times of bend holding was measure by carrying out a bending test, the thickness of each layer was measured from the cross section of the test piece, and the ratio (E1/E2) of the first evaluation value E1 to the second evaluation value E2 was calculated, which are listed in Table 1 as below. In Table 1, the obtained data was sorted in terms of the value of the number of times of bend holding.

The bending test in the present examples was carried out in accordance with the following method.

A test piece (printed wiring board 10) was arranged in a predetermined direction. A pair of metal blocks was disposed on both main surfaces of the test piece. Each metal block is a cuboid. The side surface of a metal block is pressed against a main surface of the test piece and the side surface of another metal block is pressed against the other main surface of the test piece at the corresponding position. The test piece is interposed and fixed between the pair of metal blocks.

other hand, when the continuity cannot be confirmed by the continuity test, a determination is made that the wiring of the test piece is broken.

The "number of times of bend holding," which is the number of times of the bending operation when the wiring of the test piece is broken, is listed in Table 1 as the result representing the bending resistance of the test piece (printed wiring board 10). The larger the number of times of bend holding, the higher the bending resistance can be evaluated.

TABLE 1

|  | Actually measured value of copper foil etching amount [μm] | Actually measured thickness of Ni plating [μm] | E1/E2 | Number of times of bend holding | Difference in thicknesses of conductive layers in first region and second region [μm] |
| --- | --- | --- | --- | --- | --- |
| Comparative Example 1 | 0.67 | 4.37 | 1.24 | 5 | 3.70 |
| Comparative Example 2 | 1.31 | 5.28 | 1.26 | 5 | 3.97 |
| Comparative Example 3 | 0.78 | 4.57 | 1.32 | 5 | 3.79 |
| Comparative Example 4 | 0.74 | 5.62 | 1.32 | 5 | 4.88 |
| Example 1 | 2.54 | 5.48 | 1.23 | 10 | 2.94 |
| Example 2 | 2.94 | 4.57 | 1.14 | 15 | 1.63 |
| Example 3 | 2.95 | 4.37 | 1.13 | 20 | 1.42 |
| Example 4 | 4.26 | 5.18 | 1.13 | 20 | 0.92 |
| Example 5 | 3.44 | 4.06 | 1.10 | 25 | 0.62 |
| Example 6 | 4.37 | 5.08 | 1.12 | 25 | 0.71 |
| Example 7 | 4.57 | 4.57 | 1.08 | 30 | 0.00 |
| Example 8 | 5.89 | 1.93 | 0.85 | 35 | −3.96 |
| Example 9 | 6.79 | 2.54 | 0.87 | 45 | −4.25 |
| Example 10 | 6.80 | 2.75 | 0.88 | 45 | −4.05 |
| Example 11 | 4.37 | 1.64 | 0.90 | 50 | −2.73 |
| Example 12 | 2.74 | 2.04 | 1.00 | 55 | −0.70 |
| Example 13 | 4.57 | 3.55 | 1.02 | 55 | −1.02 |
| Example 14 | 2.53 | 1.83 | 0.99 | 60 | −0.70 |
| Example 15 | 4.96 | 3.35 | 0.99 | 65 | −1.61 |
| Example 16 | 4.27 | 1.73 | 0.91 | 75 | −2.54 |
| Example 17 | 6.10 | 3.25 | 0.94 | 80 | −2.85 |
| Example 18 | 5.99 | 3.68 | 0.97 | 95 | −2.31 |
| Example 19 | 5.51 | 3.25 | 0.96 | 100 | −2.26 |

The test piece of the present examples has open end parts that are not in contact with the metal blocks. The open end parts exist at both ends of the test piece along a predetermined direction. These open end parts at both ends are provided with wiring end parts that are conductive with each other and can be connected to external electrodes. These wiring end parts are used for a continuity test, which will be described later.

The main surface of the test piece and planes of the metal blocks are perpendicular at the open end parts. In other words, the open end parts of the test piece are each movable in a range of 90 degrees to right and left, that is, a range of 180 degrees in total, with respect to sides (corners) of the metal blocks as a rotation axis. In the bending test, the length of each test piece on each side of the open end parts is made common. That is, the size of each test piece, the size of the metal blocks, and the positions of the metal blocks at which the test piece is fixed (positions with respect to the test piece) are common.

In a state in which the test piece is fixed by the metal blocks, the open end parts of the test piece are each bent 90 degrees to the right side (metal block side on a main surface side) with respect to the sides (corners) of the metal blocks as the rotation axis. Subsequently, the open end parts of the test piece are each bent 90 degrees to the left side (metal block side on the other main surface). The bending operation (reciprocating motion) to the right and left is counted as one as the number of times of bend holding. The continuity test is performed each time the bending operation is performed five times. When the continuity is confirmed by the continuity test, the bending operation is further continued. On the In the present examples, examples of the test pieces (printed wiring boards 10) of which the number of times of bend holding is 10 or more are evaluated as being excellent in the bending resistance. Table 1 lists the relationship between the number of times of bend holding and the ratio (E1/E2) of the evaluation values of each test pieces. Evaluation of each test piece is as follows.

According to the results listed in Table 1, in Examples 1 to 19, it has been found that the printed wiring boards 10 having excellent bending resistance can be obtained with 10 or more of the number of times of bend holding when the ratio (E1/E2) of the first evaluation value E1 to the second evaluation value E2 is 0.85 or more and 1.23 or less.

According to the results listed in Table 1, in Examples 2 to 19, it has been found that the printed wiring boards having excellent bending resistance can be obtained with 15 or more of the number of times of bend holding when the ratio (E1/E2) of the first evaluation value E1 to the second evaluation value E2 is 0.85 or more and 1.14 or less.

According to the results listed in Table 1, in Examples 7 to 19, it has been found that the printed wiring boards having excellent bending resistance can be obtained with 30 or more of the number of times of bend holding when the ratio (E1/E2) of the first evaluation value E1 to the second evaluation value E2 is 0.85 or more and 1.08 or less.

Table 1 also lists the difference in thickness of the first conductive layer 12 in the second region Q2 with respect to the total thickness of the first conductive layer 12 and second conductive layer 15 in the first region Q1. This difference in thickness is a difference in the total (T12(Q1)+T15) of the thickness T12(Q1) of the first conductive layer 12 formed in the first region Q1 and the thickness T15 of the second conductive layer 15 formed in the first region Q1 with reference to the thickness (T12(Q2)) of the first conductive layer 12 formed in the second region Q2. Specifically, the "difference in thickness" listed in Table 1 was obtained by subtracting the copper foil etching amount from the actually measured thickness of the nickel plating listed in the table. That is, when the "difference in thickness" listed in Table 1 is a negative value, the thickness (T12(Q1)+T15) of the first conductive layer 12 and second conductive layer 15 in the first region Q1 is thinner than the thickness (T12(Q2)) of the first conductive layer 12 formed in the second region Q2.

According to the results listed in Table 1, in Examples 8 to 19, it has been found that the printed wiring boards having excellent bending resistance can be obtained with 35 or more of the number of times of bend holding when the total thickness of the first conductive layer 12 and second conductive layer 15 in the first region Q1 is thinner than the thickness of the first conductive layer 12 in the second region Q2 (when the difference is a negative value).

Also from the results listed in Table 1, in Examples 8 to 19, it has been found that the printed wiring boards having excellent bending resistance can be obtained with 35 or more of the number of times of bend holding when the value of the thickness T15 of the second conductive layer 15 in the second region Q2 is larger than 0 [μm] and 4.0 [μm] or less.

According to the results listed in Table 1, it has been confirmed that the value of the number of times of bend holding tends to be larger when the value of the thickness T15 of the second conductive layer 15 is not larger than 4.0 [μm] as compared with when the value of the thickness T15 of the second conductive layer 15 is larger than 4.0 [μm].

DESCRIPTION OF REFERENCE NUMERALS

10 Printed wiring board
11 Insulating base material
12 First conductive layer, Copper foil
13 Adhesive later
14 Insulating layer
15 Second conductive layer, Plating layer Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. A printed wiring board comprising: an insulating base material; a first region and at least two second regions defined on a plane along a main surface of the insulating base material; a first conductive layer that comprises a wiring pattern and that is disposed on the main surface of the insulating base material in the first region and the at least two second regions, wherein a thickness of the first conductive layer in the first region is less than a thickness of the first conductive layer in the at least two second regions, the first region is sandwiched between the at least two second regions in a plan view of the printed wiring board, and the wiring pattern of the first conductive layer is a continuous structure through the first region and the at least two second regions, a second conductive layer disposed on a main surface of the first conductive layer in the first region; and an insulating layer disposed on the main surface of the first conductive layer in each of the at least two second regions, wherein the insulating layer, of each of the two second regions, does not extend to the first region, wherein a ratio of a first evaluation value E1 to a second evaluation value E2 is 0.91 or more and 0.99 or less, wherein the first evaluation value E1 is an evaluation value of strength of a first laminated part in the first region and is obtained by Equation (1), and the second evaluation value E2 is an evaluation value of strength of a second laminated part in each of the at least two second regions and is obtained by Equation (2): E1=(Young's modulus of the insulating base material×thickness of the insulating base material)+(Young's modulus of the first conductive layer×thickness of the first conductive layer)+(Young's modulus of the second conductive layer×thickness of the second conductive layer) . . . Equation (t); and E2=(Young's modulus of the insulating base material×thickness of the insulating base material)+(Young's modulus of the first conductive layer×thickness of the first conductive layer)+(Young's modulus of the insulating layer×thickness of the insulating layer) . . . Equation (2).

2. The printed wiring board according to claim 1, wherein the insulating layer has an end part on a side of the first region, and the end part is not a straight line in the plan view of the printed wiring board.

3. The printed wiring board according to claim 1, further comprising
  a terminal part comprising the second conductive layer electrically connected to a connector of an external electronic component, wherein
  the terminal part is formed between a tip end as an end part of the printed wiring board and a base end as another end part of the printed wiring board.

4. The printed wiring board according to claim 1, wherein the ratio is 0.91 or more and 0.97 or less.

5. The printed wiring board according to claim 4, wherein each of the insulating layers in each of the at least two of the second regions has an end part on a side of the first region, and the end part is not a straight line in the plan view of the printed wiring board.

6. The printed wiring board according to claim 4, further comprising
  a terminal part comprising the second conductive layer electrically connected to a connector of an external electronic component, wherein
  the terminal part is formed between a tip end as an end part of the printed wiring board and a base end as another end part of the printed wiring board.

7. A printed wiring board comprising: an insulating base material; a first region and at least two second regions defined on a plane along a main surface of the insulating base material; a first conductive layer that comprises a wiring pattern and that is disposed on the main surface of the insulating base material in the first region and the at least two second regions, wherein a thickness of the first conductive layer in the first region is less than a thickness of the first conductive layer in the at least two second regions, the first region is sandwiched between the at least two second regions in a plan view of the printed wiring board, and the wiring pattern of the first conductive layer is a continuous structure through the first region and the at least two second regions, a second conductive layer disposed on a main surface of the first conductive layer in the first region; and an insulating layer disposed on the main surface of the first conductive layer in each of the at least two second regions, wherein the insulating layer, of each of the two second regions, does not extend to the first region, wherein a ratio of a first evaluation value E1 to a second evaluation value E2 is 1.08 or more and 1.23 or less and a difference in thicknesses of the first conductive layer and the second conductive layer is 0.00 [μm] or more and 2.94 [μm] or less, wherein the first evaluation value E1 is an evaluation value of strength of a first laminated part in the first region and is obtained by Equation (1) and the second evaluation value E2 is an evaluation value of strength of a second laminated part in each of the at least two second regions and is obtained by Equation (2): E1=(Young's modulus of the insulating base material×thickness of the insulating base material)+(Young's modulus of the first conductive layer×thickness of the first conductive layer)+(Young's modulus of the second conductive layer×thickness of the second conductive layer) . . . Equation (1); and E2=(Young's modulus of the insulating base material×thickness of the insulating base material)+(Young's modulus of the first conductive layer×thickness of the first conductive layer)+(Young's modulus of the insulating layer×thickness of the insulating layer) . . . Equation (2).

8. The printed wiring board according to claim 7, wherein the insulating layer has an end part on a side of the first region, and the end part is not a straight line in the plan view of the printed wiring board.

9. The printed wiring board according to claim 7, further comprising
- a terminal part comprising the second conductive layer electrically connected to a connector of an external electronic component, wherein
- the terminal part is formed between a tip end as an end part of the printed wiring board and a base end as another end part of the printed wiring board.

* * * * *